United States Patent
Park et al.

(10) Patent No.: US 12,063,014 B2
(45) Date of Patent: *Aug. 13, 2024

(54) AMPLIFIER HAVING ELECTROSTATIC DISCHARGE AND SURGE PROTECTION CIRCUIT

(71) Applicant: SKYWORKS SOLUTIONS, INC., Irvine, CA (US)

(72) Inventors: Myunghwan Park, Irvine, CA (US); Jermyn Tseng, Irvine, CA (US); John Tzung-Yin Lee, Costa Mesa, CA (US); David Steven Ripley, Marion, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 54 days.

This patent is subject to a terminal disclaimer.

(21) Appl. No.: 17/580,549

(22) Filed: Jan. 20, 2022

(65) Prior Publication Data
US 2022/0140792 A1 May 5, 2022

Related U.S. Application Data

(63) Continuation of application No. 16/779,598, filed on Feb. 1, 2020, now Pat. No. 11,233,486.

(60) Provisional application No. 62/800,412, filed on Feb. 1, 2019.

(51) Int. Cl.
*H03F 1/52* (2006.01)
*H01L 27/02* (2006.01)
*H03F 3/195* (2006.01)

(52) U.S. Cl.
CPC ......... *H03F 1/523* (2013.01); *H01L 27/0266* (2013.01); *H03F 3/195* (2013.01); *H03F 2200/441* (2013.01); *H03F 2200/451* (2013.01)

(58) Field of Classification Search
CPC .......................................................... H03F 1/52
USPC ................................................. 330/298, 207 P
See application file for complete search history.

(56) References Cited

U.S. PATENT DOCUMENTS

| | | | |
|---|---|---|---|
| 8,803,190 B2 * | 8/2014 | Nakamura | H01L 29/866 257/341 |
| 9,954,430 B2 * | 4/2018 | Horváth | H02H 9/041 |
| 10,069,650 B2 * | 9/2018 | Munoz | H04L 12/6418 |
| 10,211,795 B2 * | 2/2019 | Wallis | H03F 1/523 |
| 10,819,110 B2 * | 10/2020 | Kumar | H01L 27/0285 |
| 11,038,096 B2 * | 6/2021 | Modi | H03H 9/6406 |

* cited by examiner

*Primary Examiner* — Henry Choe
(74) *Attorney, Agent, or Firm* — Chang & Hale LLP

(57) ABSTRACT

Amplifier having electrostatic discharge and surge protection circuit. In some embodiments, a radio-frequency integrated circuit can include an amplifier, a controller configured to control operation of the amplifier, and a clamp circuit configured to provide electrostatic discharge protection and surge protection for either or both of the amplifier and the controller. The clamp circuit can include a feedback combination clamp implemented to direct a current associated with either or both of an electrostatic discharge and a surge at a first node to a second node.

17 Claims, 12 Drawing Sheets

AMPLIFIER HAVING ELECTROSTATIC DISCHARGE AND SURGE PROTECTION CIRCUIT

CROSS-REFERENCE TO RELATED APPLICATION(S)

This application is a continuation of U.S. application Ser. No. 16/779,598 filed Feb. 1, 2020, entitled CONCURRENT ELECTROSTATIC DISCHARGE AND SURGE PROTECTION CLAMPS IN POWER AMPLIFIERS, which claims priority to and the benefit of the filing date of U.S. Provisional Application No. 62/800,412 filed Feb. 1, 2019, entitled CONCURRENT ELECTROSTATIC DISCHARGE AND SURGE PROTECTION CLAMPS IN POWER AMPLIFIER, the benefits of the filing dates of which are hereby claimed and the disclosures of which are hereby expressly incorporated by reference herein in their entirety.

BACKGROUND

Field

The present disclosure relates to protection circuits for radio-frequency (RF) power amplifiers.

Description of the Related Art

In radio-frequency (RF) applications, an amplifier is typically utilized to amplify a signal. For example, a power amplifier can be utilized to amplify a signal generated by a transmitter, for transmission through an antenna. To operate such a power amplifier, a supply voltage is typically provided to an amplifying transistor of the power amplifier.

SUMMARY

According to some implementations, the present disclosure relates to a semiconductor die that includes a semiconductor substrate and an integrated circuit implemented on the semiconductor substrate. The integrated circuit includes a power amplifier and a controller. The semiconductor die further includes a clamp circuit implemented on the semiconductor substrate and configured to provide electrostatic discharge protection and surge protection for at least some of the integrated circuit.

In some embodiments, the clamp circuit can include a feedback combination clamp implemented to direct a current associated with either or both of an electrostatic discharge and a surge at a first node of the integrated circuit to a second node. The first node can be electrically connected to a supply pin of the semiconductor die, and the second node can be electrically connected to a ground of the semiconductor die.

In some embodiments, the feedback combination clamp can include a first transistor that couples the first node and the second node, and configured to be electrically non-conductive when the feedback combination clamp is in an inactive state, and to be electrically conductive when the feedback combination clamp is in an active state. The first transistor can be a field-effect transistor having a drain coupled to the first node and a source coupled to the second node.

In some embodiments, the feedback combination clamp can further include a feedback circuit having a second transistor, a first resistance, and a second resistance arranged in series between the first node and the second node, such that a source of the second transistor is coupled to the first node, and the gate of the first transistor is coupled to a node between the first and second resistances.

In some embodiments, the feedback combination clamp can further include a surge pulldown circuit having a third transistor, a third resistance, a fourth transistor and a fifth transistor arranged in series between the first node and the second node, such that a source of the third transistor is coupled to the first node, a gate of the second transistor is coupled to a node between the third resistance and the fourth transistor, and the gate of the first transistor is coupled to a gate of the third transistor.

In some embodiments, the feedback combination clamp can further include a sixth transistor that couples the first node and the gate of the third transistor.

In some embodiments, the feedback combination clamp can further include a transient detection circuit having a fourth resistance and a capacitance arranged in series between the first node and the second node, such that a gate of the fifth transistor is coupled to a node between the fourth resistance and the capacitance.

In some embodiments, the feedback combination clamp can be configured to be in the active state for a prolonged period of time due to a partial feedback provided at least in part by the feedback circuit. In some embodiments, the feedback combination clamp can be configured such that when RC, a product of the fourth resistance and the capacitance of the transient detection circuit, is below a first selected time constant, the sixth transistor turns on thereby causing the third transistor to turn off, and the second transistor turns on to enable the first transistor to provide a discharge path between the first node and the second node. In some embodiments, the feedback combination clamp can be further configured such that when the value of RC is greater than a second time constant, the fourth and fifth transistors are activated while the gate of the first transistor is pulled low, such that the gate of the first transistor is partially fed back and pulled high from the second transistor turning on by the fourth and fifth transistors surge pull down.

In some embodiments, the first transistor can be configured such that drain to gate and source to gate regions of the first transistor are un-silicided.

In some embodiments, the clamp circuit can include a ballasted RC-triggered clamp.

In some teachings, the present disclosure relates to a radio-frequency module that includes a packaging substrate and an integrated circuit implemented on the packaging substrate. The integrated circuit includes a power amplifier and a controller. The radio-frequency module further includes a clamp circuit implemented on the packaging substrate and configured to provide electrostatic discharge protection and surge protection for at least some of the integrated circuit.

In some embodiments, substantially all of the power amplifier, the controller and the clamp circuit can be implemented on a common semiconductor die. In some embodiments, the clamp circuit can include a feedback combination clamp. In some embodiments, the clamp circuit can include a ballasted RC-triggered clamp.

In accordance with a number of implementations, the present disclosure relates to a wireless device that includes a transceiver and a radio-frequency module in communication with the transceiver and configured to process a signal. The radio-frequency module includes an integrated circuit that includes a power amplifier and a controller. The radio-frequency module further includes a clamp circuit configured to provide electrostatic discharge protection and surge protection for at least some of the integrated circuit. The wireless device further includes an antenna in communication with the radio-frequency module and configured to support operation of the wireless device with the signal.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

In radio-frequency (RF) applications, a power amplifier is typically implemented on a die, and such a die is typically a part of a module. Such a power amplifier can be subjected to harmful electrical conditions such as electrostatic discharges (ESDs) and surges.

By way of an example, a power amplifier may be susceptible to harmful electrical conditions through one or more power amplifier supply pins. Accordingly, a module design (e.g., a power amplifier module) likely includes, for example, either or both of component-level human body model (HBM) and system-level electrostatic overstress (EOS) surge protection. For cost reduction and device miniaturization efforts, the system-level surge suppressor is often removed, which can make concurrent HBM and surge compliant power clamps desirable. Described herein are examples related to surge and HBM performance of a conventional edge-triggered power clamp and gate-coupled NMOS (GCNMOS), where NMOS refers to N-type metal-oxide-semiconductor. Also described herein are examples related to a partial feedback combination clamp and a ballasted RC-triggered clamp, where R refers to resistance and C refers to capacitance.

It is noted that in many applications, ESD and EOS surge protection standards are handled or managed differently between integrated circuit designers and module component designers. Typically, integrated circuit designers plan out an on-chip level ESD protection scheme for HBM, machine model (MM), and charge device model (CDM) qualifications, whereas the EOS surge and International Electrotechnical Commission (IEC) protections are managed through board-level designs (e.g., see C. Duvvury, "New perspectives on component and system ESD", EDSSC 2014, pp. 1-2). Recently, the foregoing way of handling ESD and EOS surge separately by the two design functions has changed due to a drive in device miniaturization and cost reduction (e.g., see M. Tsai, "An on-chip combo clamp for surge and universal ESD protection in bulk FinFET technology", EOS/ESD 2016, pp. 1-7; S.-F. Hsu, J.-Y. Jao, "A novel 8 kV on-chip surge protection design in xDSL line driver IC", IRPS 2015, pp. 1-4; and S. Marum, et. al., "Protecting circuits from the transient voltage suppressor's residual pulse during IEC 61000-4-2 stress", EOS/EDS 2009, pp. 1-10).

Figure 1:
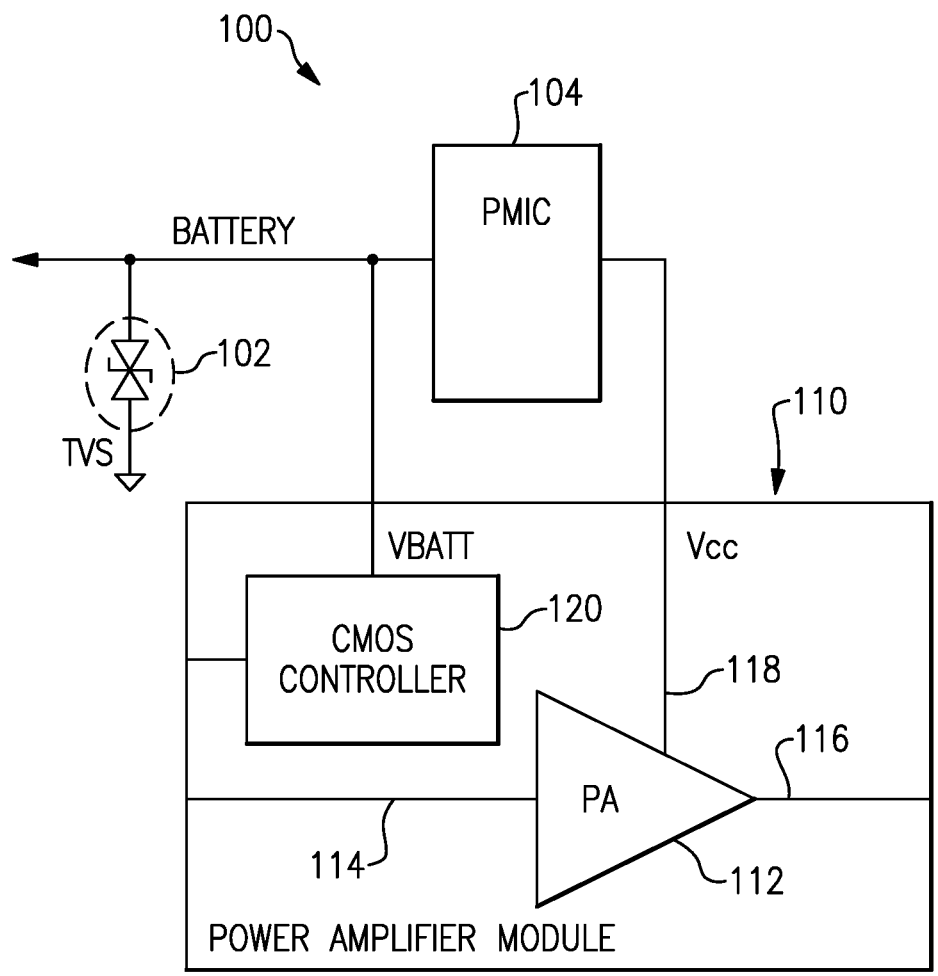
FIG. 1 shows an example configuration where a power amplifier module is provided with power from a power source such as a battery.

FIG. 1 shows an example of a power management architecture 100 that can be implemented in an RF device such as a wireless device. Such a power management architecture can include a supply voltage Vcc being provided to a power amplifier 112 through a supply path 118. Such a supply voltage (Vcc) can be generated by a power management integrated circuit (PMIC) 104 based on a battery voltage Vbatt.

In FIG. 1, the power amplifier 112 is shown to be configured to receive a signal through an input path 114 and provide an amplified signal through an output path 116. Operation of such a power amplifier can be controlled by a controller 120. Such a controller can receive input control signal and be powered by, for example, battery voltage Vbatt.

In the example of FIG. 1, the power amplifier 112 is depicted as being a part of a power amplifier module 110. Such a module may also be referred to herein as a chip. It will be understood that a chip can also refer to a die (e.g., a power amplifier die), a packaged module (e.g., a packaged power amplifier module), or some combination thereof.

In RF power amplifier (PA) designs for mobile handset applications, and as depicted in FIG. 1, an off-chip component such as a transient-voltage-suppression (TVS) diode is typically placed along a battery connection to mainly mitigate an EOS surge. In some designs, such a component is removed for cost reduction and device miniaturization. Accordingly, an EOS surge stress is now imposed on on-chip ESD designs.

Traditionally, an edge-triggered power clamp is favored for providing HBM and CDM protection of DC supply pins (e.g., associated with the Vcc supply path 118 in FIG. 1) due to its lower clamped voltage and ease of simulation and modeling. However, such an edge-triggered power clamp in the power amplifier application only turns on during an HBM event, and is not suitable for an EOS surge event. Thus, a supply-rail power clamp that meets both HBM/CDM and EOS surge qualification standards is desirable.

Disclosed herein are examples related to evaluation and comparison of HBM and EOS surge performance of the conventional edge-triggered clamp and snap-back based clamp. Also disclosed are examples related to a ballasted RC clamp and partial feedback clamp for concurrent HBM and EOS surge protection of, for example, one or more PA supply pins.

A rail-based clamp can largely be operated or triggered by RC transient detection and snapback-assisted bipolar action. The RC-triggering design allows large field-effect transistors (FETs) to conduct while detecting an ESD transient. A typical RC-triggering is designed for a duration of under 1 μs, typically just enough for HBM and CDM pulse width. After this, the clamp does not operate.

Described herein are examples of various types of rail-based power clamps. The RC-triggered clamp and gate-coupled NMOS are typical candidates. Also described are examples related to a partial feedback power clamp and ballasted RC-triggered clamp as concurrent rail-based clamp solutions for HBM and EOS surge standards.

Figure 2:
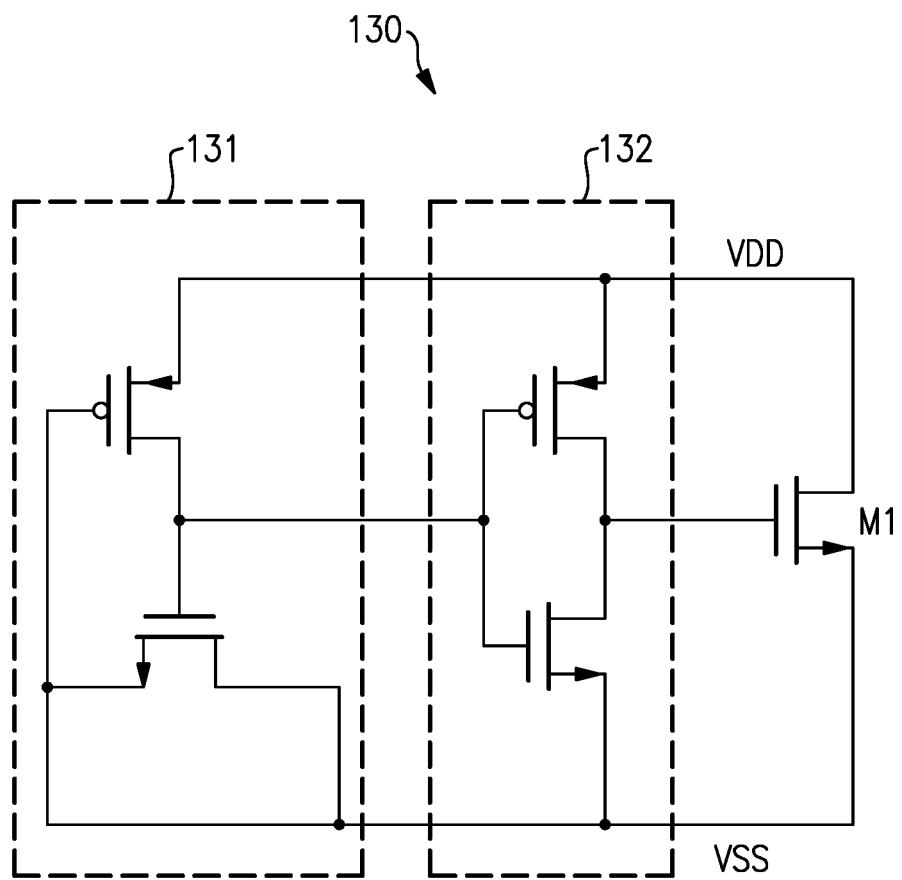
FIG. 2 shows an example of an RC-triggered clamp.

FIG. 2 shows an RC-triggered clamp 130 that typically includes an ESD transient detection RC timer 131, an inverter 132, and an ESD discharging big NFET M1. When an HBM transient is detected at the VDD node, the gate of M1 is immediately pulled up high, and the channel of M1 conducts. However, after an HBM transient has charged up, or after an HBM event, the gate of M1 is pulled down. Since the regular or silicided M1 NFET in the foregoing RC-trigged clamp 130 has a relatively low BVDSS, such a configuration will be very weak for EOS surge standards.

On the other hand, a gate-coupled NMOS triggers from a snap-back bipolar assisted action. Typical triggering voltages can be tuned by the amount of Rgs and Cgd coupling, while each of the fingers of the drain and source active regions can be un-silicided for uniform, or approximately uniform, current distribution under a high ESD current.

Figure 3:
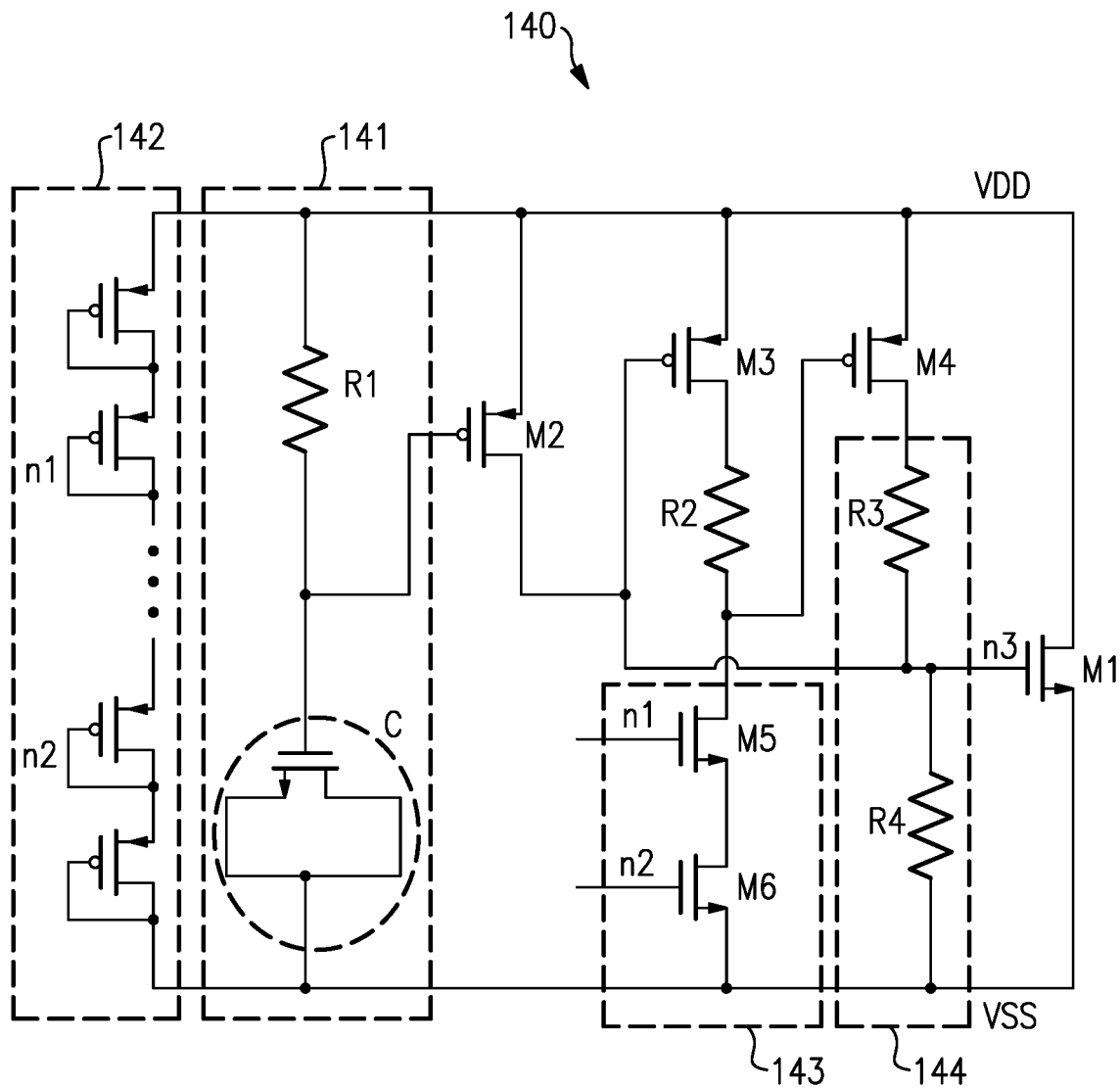
FIG. 3 shows that in some embodiments, a clamp can be implemented based on RC transient detection, with a discharging time prolonged with a partial feedback mechanism.

FIG. 3 shows that in some embodiments, a clamp 140 can be implemented based on RC transient detection. More particularly, a transient detection circuit 141 can include a resistance R1 and a capacitance C arranged in series between drain and source nodes of an NFET M1, similar to the example of FIG. 2. In some embodiments, each of the resistance R1 and the capacitance C may or may not be similar to the respective counterpart of FIG. 2.

Referring to FIG. 3, the NFET M1 is shown to have a drain node with voltage VDD, a source node with voltage VSS, and a gate node n3. The drain node (VDD) and the gate node (n3) of M1 are shown to be coupled through a transistor M4 (with the source of M4 being connected to the drain of M1) and a resistance R3, and the source node (VSS) and the gate node (n3) of M1 are shown to be coupled through a resistance R4.

Referring to FIG. 3, the drain node (VDD) and the source node (VSS) of M1 are shown to be coupled through a transistor M3 (with the source of M3 being connected to the drain of M1), a resistance R2, a transistor M5 (with the drain of M5 being connected to the resistance R2), and a transistor M6 (with the drain of M6 being connected to the source of M5, and the source of M6 being connected to the source of M1). The gate of M5 is indicated as a node n1, and the gate of M6 is indicated as n2.

Referring to FIG. 3, a node between the resistance R2 and the transistor M5 is shown to be connected to the gate of M4. Also, the gate of the transistor M3 is shown to be connected to the gate node (n3) of M1.

Referring to FIG. 3, the drain node (VDD) and the gate node (n3) of M1 are shown to be coupled through a transistor M2 (with the source of M2 being connected to the drain of M1, and the drain of M2 being connected to the gate of M1). Accordingly, the drain of M2 is also connected to the gate of M3.

Referring to FIG. 3, a node between the resistance R1 and the capacitance C of the transient detection circuit 141 is shown to be connected to the gate of M2.

Referring to FIG. 3, a voltage divider circuit 142 can be provided between the drain node (VDD) of M1 and the source node (VSS) of M1. Such a voltage divider can include a series of diode-connected FETs, and such diode-connected FETs can be grouped into a first group and a second group. A selected one of the first group of diode-connected FETs can have its gate-drain connected node be connected to the gate node (n1) of the above-referenced transistor M5. Similarly, a selected one of the second group of diode-connected FETs can have its gate-drain connected node be connected to the gate node (n2) of the above-referenced transistor M6.

Configured in the foregoing manner, the clamp 140 can include a surge pulldown functionality generally indicated as 143, and a partial feedback functionality generally indicated as 144. Examples related to such functionalities are described herein in greater detail.

In the clamp 140 of FIG. 3, the discharging time of M1 can be prolonged due to a partial feedback provided at least in part by the partial feedback block 144. For example, when RC transient is below a time constant (e.g., within the duration of HBM waveform at the VDD node), M2 turns on, causing M3 to turn off, and then M4 turns on to enable M1 big NFET to discharge the HBM current (e.g., from VDD to VSS). When RC transient is greater than time constant of the RC detection circuit (e.g., the circuit is detecting the tens of μs surge stress waveform at the VDD node), the M5 and M6 are activated while n3 node of M1 is pulled low. The n3 node is partially fed back and pulled high from M4 turning on by M5 and M6 surge pull down.

Figure 4A:
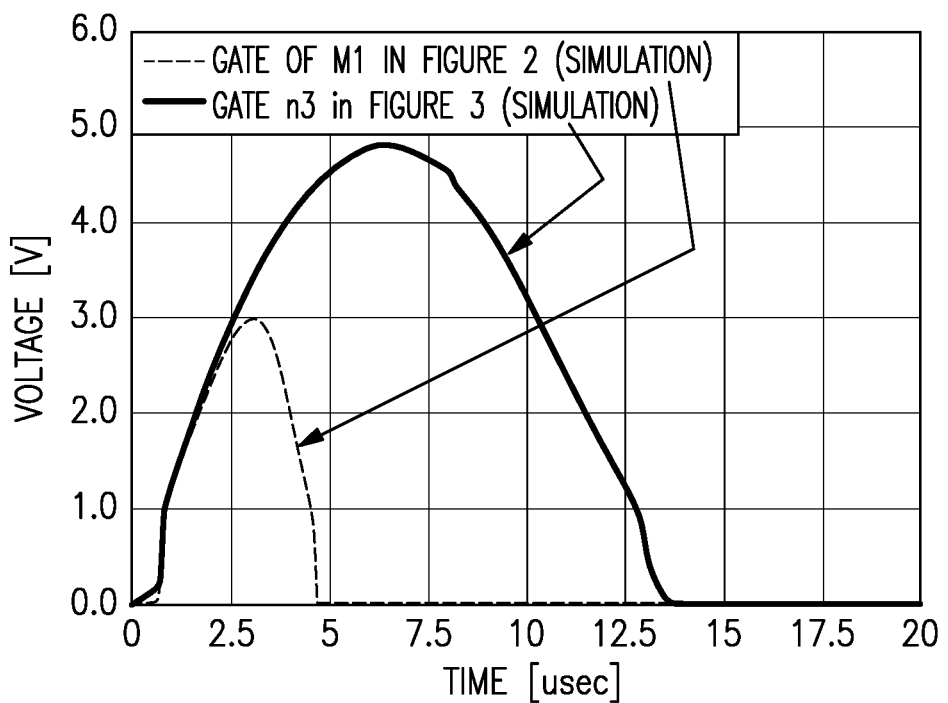
FIG. 4A shows an example of difference in characteristic of the clamp of FIG. 2 and the clamp of FIG. 3.
Figure 4B:
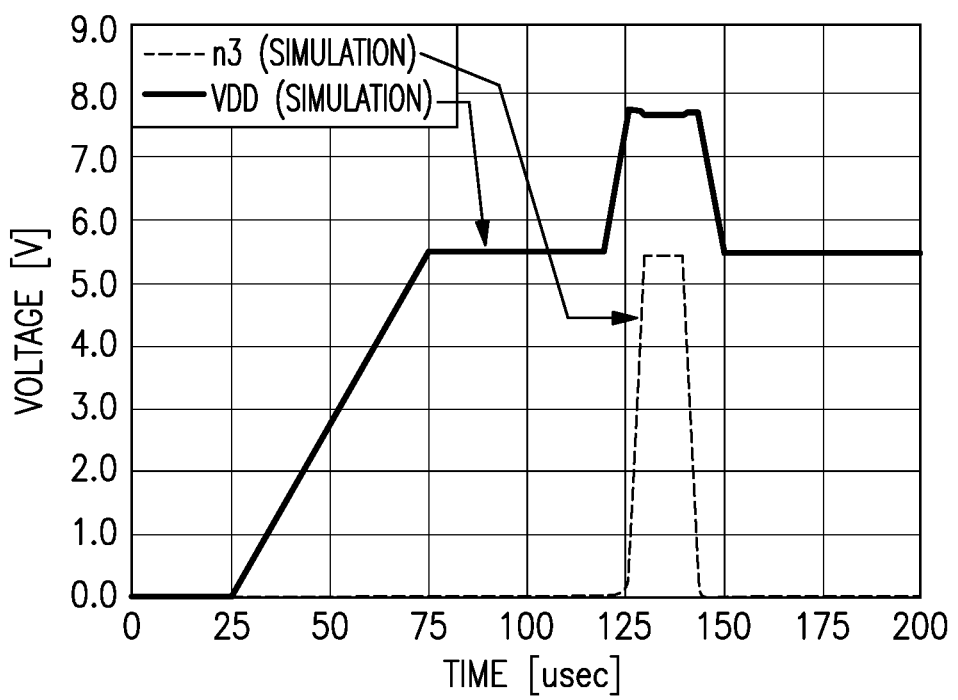
FIG. 4B shows another example of difference in characteristic of the clamp of FIG. 2 and the clamp of FIG. 3.

The foregoing partial feedback enables the gate n3 of M1 the clamp 140 of FIG. 3 to turn on longer than the gate of M1 of the RC-triggered clamp 130 of FIG. 2, as shown in FIG. 4A. In addition, simulation has verified that the clamp 140 of FIG. 3 would not falsely trigger during normal DC operation, but only turn on for a surge-like pulse. FIG. 4B shows that VDD is ramped up to 5.5V at 50 μsec ranges, and the gate n3 of M1 of the clamp 140 of FIG. 3 remains off. Only when the surge-like transient is detected at 125 μsec, one can see that the gate n3 is pulled high for a 25 μsec duration of surge.

Figure 5:
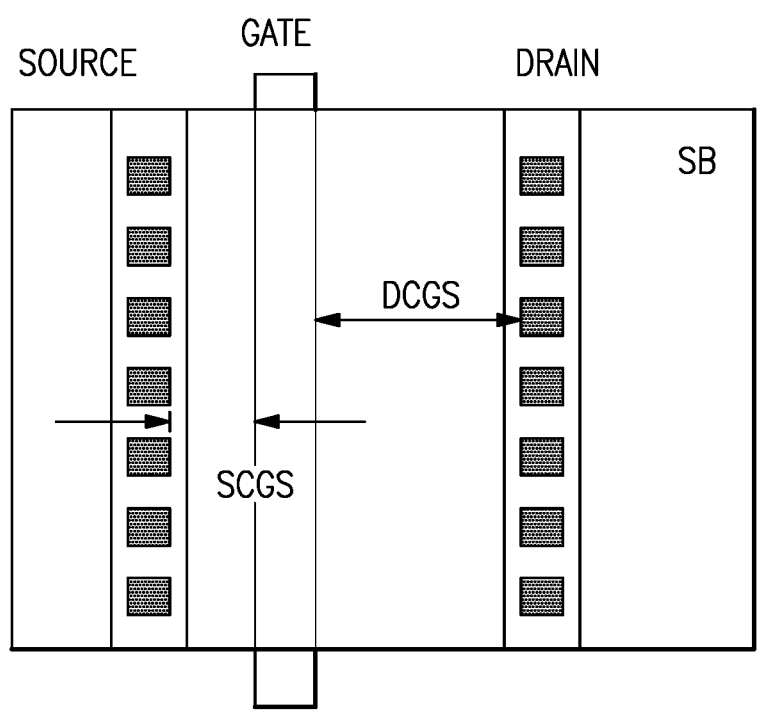
FIG. 5 shows an example of a transistor that can be utilized for a ballasted RC-triggered clamp.

In some embodiments, a ballasted RC-triggered clamp can be configured to be similar in design to FIG. 2, except in the M1 transistor. FIG. 5 shows that in such embodiments, drain to gate and source to gate regions of M1 can be un-silicided. In some embodiments, the DCGS and SCGS parameters in the example of FIG. 5 can be varied to account for different surge ratings.

Four designs described above were fabricated using CMOS 0.18 μm technology. 100 ns transmission line pulse (TLP) measurement, and surge measurement techniques to characterize each of the four clamp designs implemented as stand-alone clamps, were utilized. DC leakage current was also monitored in power amplifier operation bias ranges, up to 6V.

The 100 ns/10 ns TLP measurement JT2, Ron and clamped voltages at HBM 2 kV parameters are compared and summarized in Table 1. It is noted that JT2 is a normalized TLP IT2, and Ron is extracted at HBM 2 kV. The triggering mechanisms of the listed four clamps are different. The RC-triggered clamp (FIG. 2) and the feedback combination clamp (FIG. 3) turn on and discharge HBM by channel conduction of the FET M1. The ballasted RC-triggered clamp (FIG. 5) triggers by the M1 FET channel conduction, and then bipolar action is also triggered afterwards. The GCNMOS is triggered by bipolar action from the beginning. Due to this nature, for JT2 of TLP, GCNMOS can operate at higher TLP current given the area, while the RC-triggered clamp shows the least JT2. The same trend in Ron can be observed by these different mechanisms. In applications where these clamps are utilized for the supply pin, it is important to note the clamped voltages at HBM 2 kV. The clamped voltage for GCNMOS is not good even though Ron is good since Vt1 happens around 6V. The clamped voltage of the ballasted RC-triggered clamp is considered good since early bipolar action triggers and results in low Ron operation.

TABLE 1

| | JT2 [mA/μ] | Ron [ohm] | Clamped voltage [V] |
|---|---|---|---|
| RC-triggered clamp (FIG. 2) | 0.83 | 4.84 | 8.22 |
| GCNMOS | 7.65 | 1.84 | 8.47 |
| Ballasted RC-triggered clamp (FIG. 5) | 3.30 | 2.26 | 6.15 |
| Feedback combination clamp (FIG. 3) | 1.12 | 1.09 | 7.77 |

Figure 6:
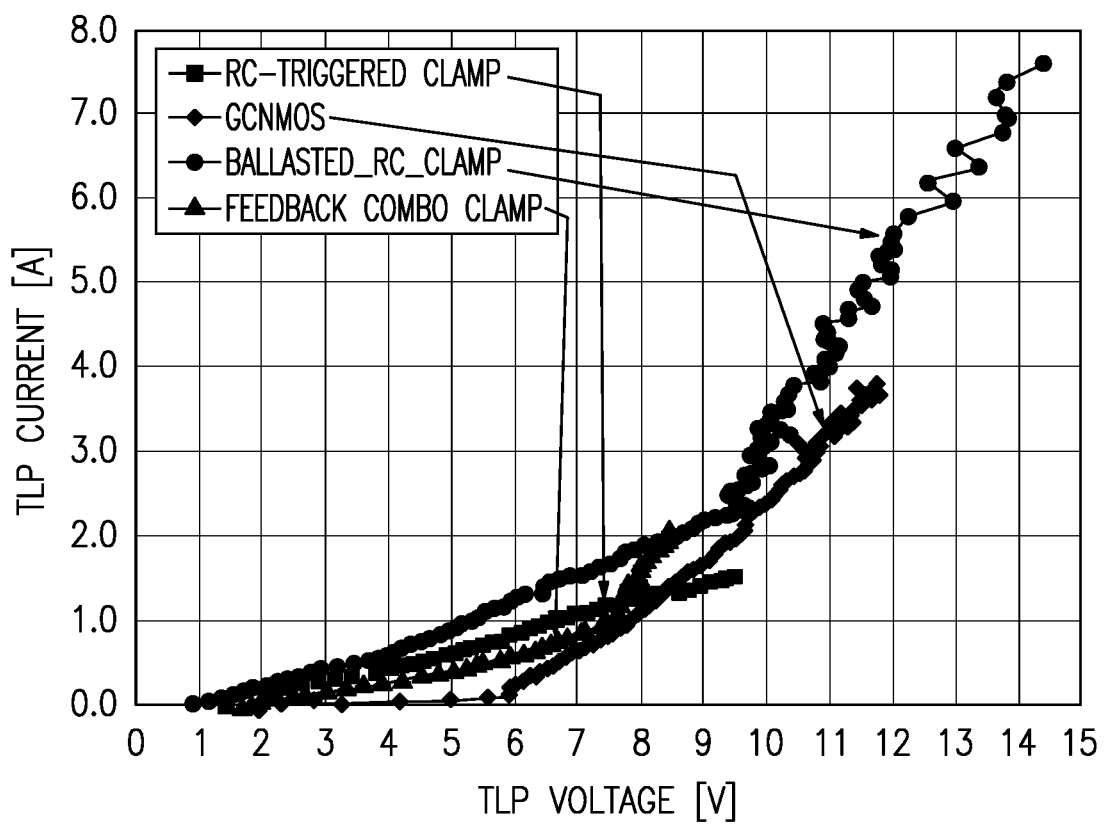
FIG. 6 shows examples of transmission line pulse (TLP) measurements for an RC-triggered clamp, a GCNMOS, a ballasted RC-clamp, and a feedback combination clamp.

FIG. 6 shows the measured 100 ns TLP results for the RC-triggered clamp (FIG. 2), GCNMOS, ballasted RC-clamp (FIG. 5), and feedback combination clamp (FIG. 3). For the ballasted RC clamp, the HBM is discharged with the channel turn on at 1V, and at around 9.5V, the bipolar action also discharges the HBM.

Figure 7:
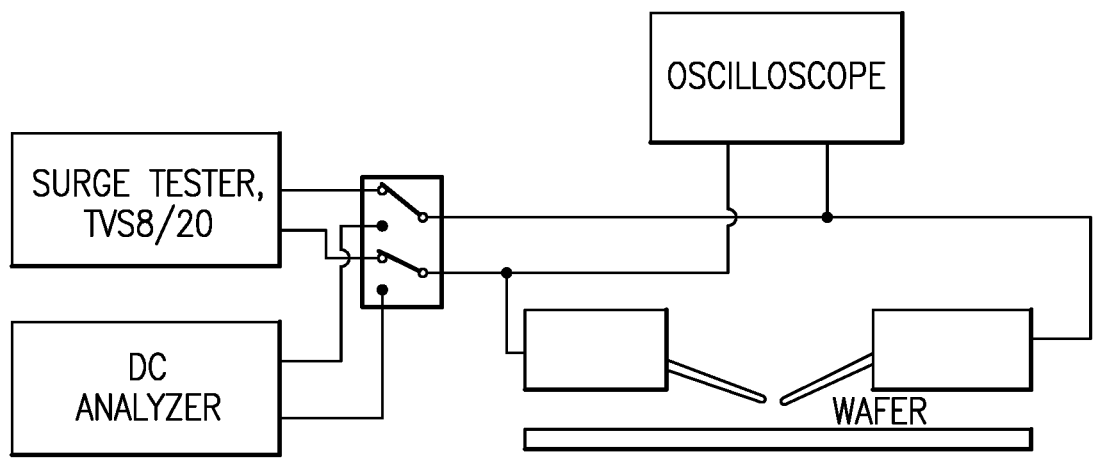
FIG. 7 shows an example configuration that can be utilized for an on-chip surge stress measurement.

On-chip surge stress measurement was performed per IEC 61000-4-5 standard (e.g., see 61000-4-5, "Electromagnetic compatibility (EMC)—Part 4-5: Testing and measurement techniques—Surge immunity test", IEC, 3rd ed., 2014). As the surge tester voltage is increased, the DC leakage current of the device under test (DUT) is monitored via a semiconductor DC parameter analyzer, as shown in FIG. 7. The mechanical switch box enables the system to check DC standby current with every stepping surge voltage.

Figure 8:
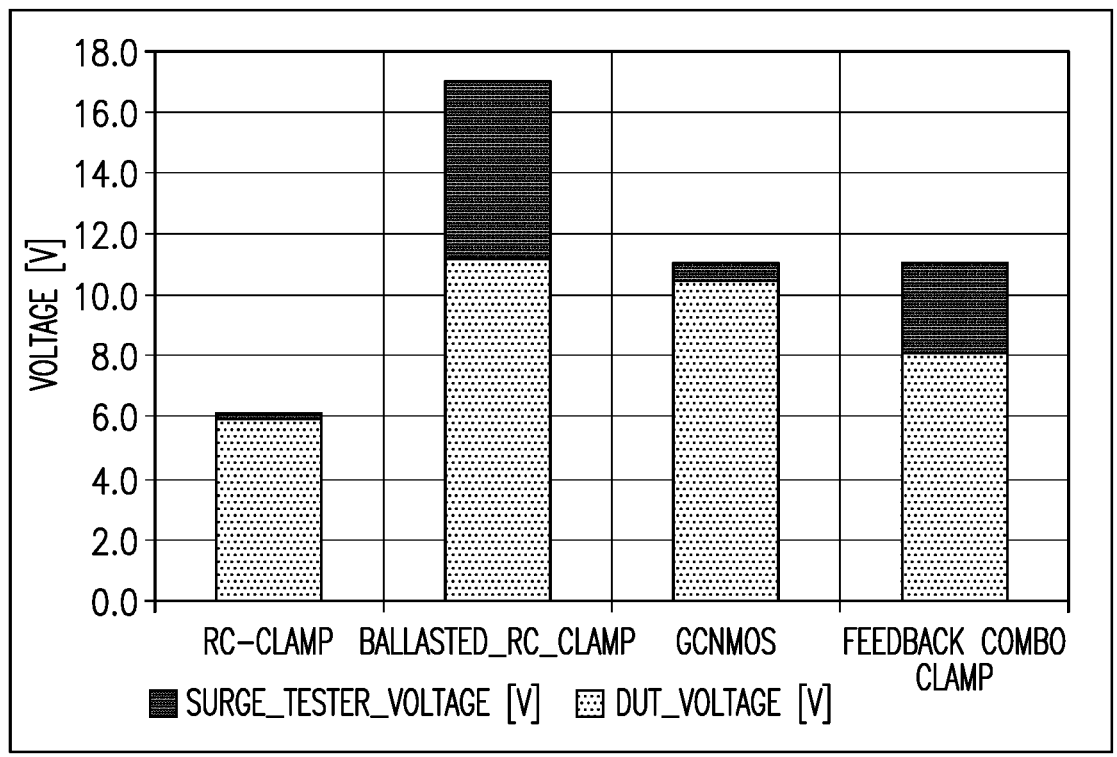
FIG. 8 compares surge performance measurements associated with various clamps.

FIG. 8 compares the surge performance of different clamps. The surge tester voltages are the ratings for which the clamps can sustain, as in IEC 61000-4-5 standard. The DUT voltages are the readings from peak voltages across the clamps before surge failure (e.g., see S. Marum, et. al., "Characterizing devices using the IEC 61000-4-5 surge stress", EOS/EDS 2012, pp. 1-9). The difference of the two, which is illustrated as the dark shaded area in FIG. 8, at least qualitatively equates the discharging of surge current for the clamp. The ballasted RC clamp shows 17V of surge, while the RC clamp shows 6V surge. This is due to the ballasted current distribution from the unsilicided regions. Since the feedback combination clamp actually turns on for the elongated time, the surge rating is higher at 11V. Table 2 compares surge performance among different widths of unsilicided regions. The DCGS and SCGS of the ballasted RC clamped are adjusted and both surge tester voltage and DUT voltage are monitored, as shown in Table 2. As expected, a higher level of ballasting with wider DCGS and SCGS, the surge performance is much improved from 6.1V surge pass with no ballasting, to 20V surge pass with 5.88 times wider ballasting.

TABLE 2

| DCGS + SCGS [a.u.] | Surge tester voltage [V] | DUT voltage [V] |
|---|---|---|
| 0 | 6.1 | 6.0 |
| 1.00× | 7.0 | 6.2 |
| 1.66× | 9.0 | 7.4 |
| 4.00× | 17.0 | 11.2 |
| 5.88× | 20.0 | 12.8 |

Table 3 summarizes the normalized standby DC leakage current of different clamps at DC supply conditions at 5V with 25 C and 85 C temperature variation. It is noted that the DC standby current for the feedback combination clamp is higher than other three due to feedback circuitry. The ballasted RC-clamp is still comparable to the RC-triggered clamp.

TABLE 3

| Normalized standby leakage current @ 5 V [nA/μ] | @ 25° C. | @ 85° C. |
|---|---|---|
| RC-triggered clamp (FIG. 2) | 1.00× | 49.00× |
| Ballasted RC-triggered clamp (FIG. 5) | 2.05× | 61.40× |
| GCNMOS | 1.92× | 69.04× |
| Feedback combination clamp (FIG. 3) | 35.87× | 277.03× |

Figure 9:
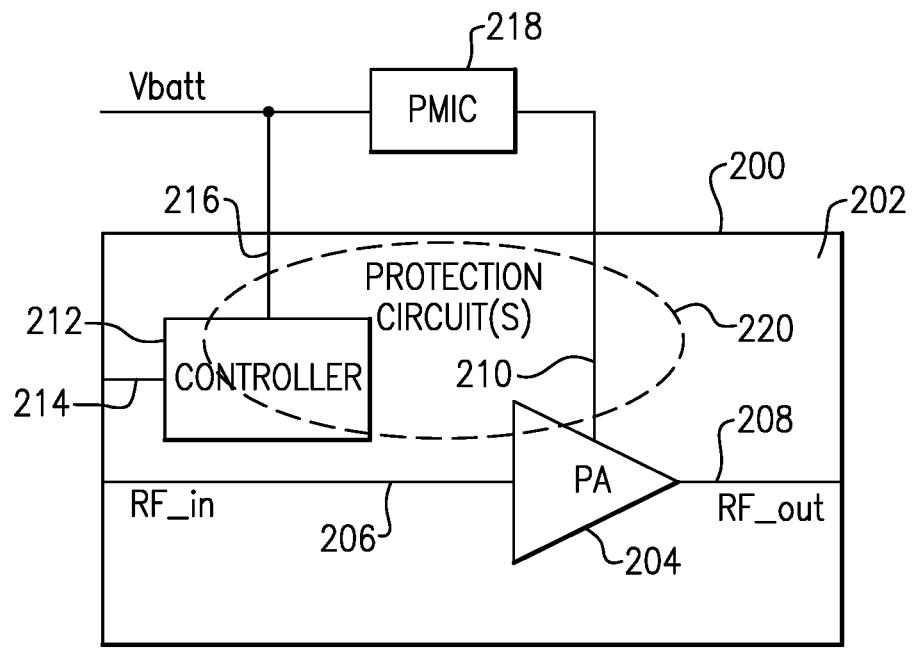
FIG. 9 shows a chip device that includes a clamp circuit having one or more features as described herein.

FIG. 9 shows that in some embodiments, one or more protection circuits 220 can be implemented as part of a radio-frequency chip device 200. As described herein, such a chip device can be a semiconductor die, a packaged module having one or more die, or some combination thereof.

In the example of FIG. 9, the chip device 200 can include a substrate 202. If the chip device 200 is a semiconductor die, the substrate 202 can be a semiconductor substrate. If the chip device 200 is a packaged module, the substrate 202 can be a packaging substrate.

In the example of FIG. 9, the implementation of one or more protection circuits 220 can allow removal of a protection circuit outside of the chip device 200. For example, in the context of the architecture of FIG. 1, the TVS 102 that is implemented outside of the power amplifier module 110 can be eliminated from the power management architecture 100.

It is noted that the example of FIG. 9 is implemented in an radio-frequency application similar to the example of FIG. 1. Accordingly, the chip device 200, having a substrate 202, is shown to include a power amplifier 204 configured to amplify an input signal RF_in received through an input path 206, and generate an output signal RF_out through an output path 208. Operation of such a power amplifier can be controlled by a controller 212 (e.g., a CMOS controller) configured to receive one or more input signals such as a control signal through one or more input pins (depicted as 214).

As shown in FIG. 9, the power amplifier 204 can be provided with a supply voltage through a supply path 210 that is electrically connected to a supply pin on the chip device 200. Such a supply pin is shown to be connected to a supply voltage source, such as a battery voltage (Vbatt) through a power management integrated circuit (PMIC) 218.

As also shown in FIG. 9, the controller 212 can be provided with power through a supply path 216 that is electrically connected to a supply pin on the chip device 200. Such a supply pin is shown to be connected to a supply voltage source such as a battery voltage (Vbatt).

FIG. 9 shows that in some embodiments, the chip device 200 can include one or more clamp circuits having one or more features as described herein. Such clamp circuit(s) can be implemented at different locations of the chip device 200. Accordingly, in FIG. 9 such clamp circuit(s) are depicted as 220. Non-limiting examples of implementations of such clamp circuit(s) are described herein in greater detail.

Figure 10A:
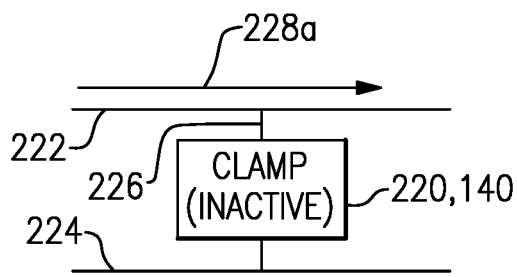
FIGS. 10A and 10B show an example of how the clamp circuit of FIG. 9 can be implemented.
Figure 10B:
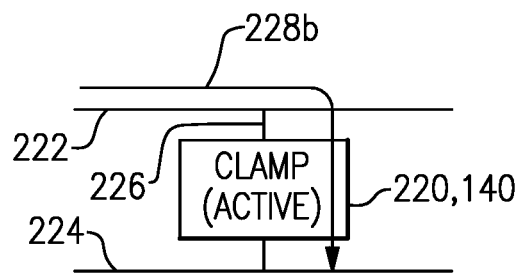

FIGS. 10A and 10B show an example of how each of the clamp circuit(s) of FIG. 9 can be implemented within the chip device (200 in FIG. 9). In some embodiments, a clamp circuit (indicated as 220, 140) such as the clamp circuit 140 of FIG. 3 can be implemented along a first node 220 so as to allow an electrical current to be re-directed to a second node 224. The first node 222 can be, for example, a supply node where a supply voltage is present and also susceptible to an electrical disturbance (e.g., ESD and/or surge).

In the example of FIG. 9, such a first node (222) can be, a node coupled to either or both of the supply pins 210, 216. In the context of the clamp circuit 140 of FIG. 3, the VDD node of the clamp circuit 140 can be coupled to the first node 222 of FIGS. 10A and 10B.

Referring to FIGS. 9 and 10, the second node 224 can be a node where a re-directed current associated with the electrical disturbance can be directed to. Such a second node can be, for example, a ground node. In the context of the clamp circuit 140 of FIG. 3, the VSS node of the clamp circuit 140 can be coupled to the second node 224 of FIGS. 10A and 10B.

FIGS. 10A and 10B show the clamp circuit (220, 140) in its inactive state and active state, respectively. When the clamp circuit (220, 140) is inactive (FIG. 10A), an electrical current 228*a* present at the first node 222 is allowed to continue to its destination load (e.g., to the right along the node 222). However, when the clamp circuit (220, 140) is activated as described herein, an electrical current 228*b*, including a current associated with an electrical disturbance (e.g., ESD and/or surge) is re-directed from the first node 222 to the second node 224 through the clamp circuit (220, 140), so as to prevent the harmful electrical disturbance from reaching the destination load.

Figure 11A:
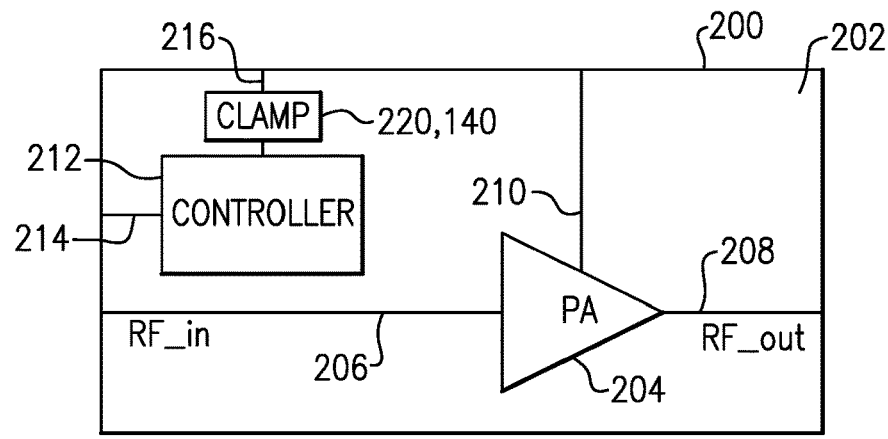
FIGS. 11A, 11B and 11C show examples of portions of the chip device where the clamp circuit of FIG. 9 can be implemented.
Figure 11B:
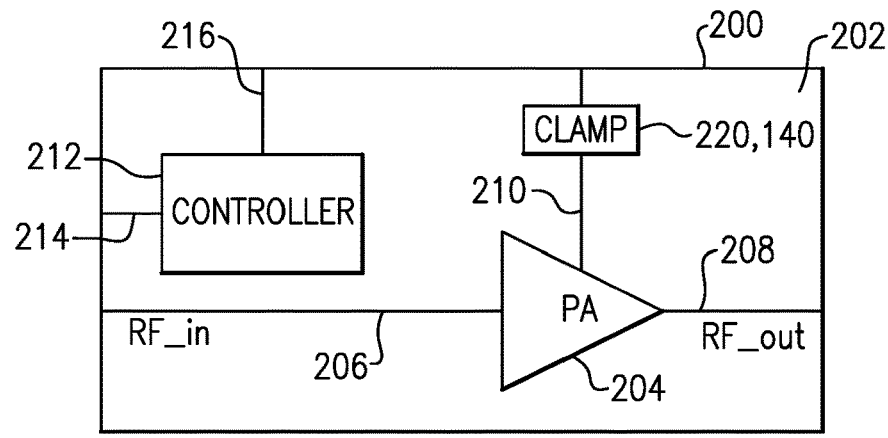
Figure 11C:
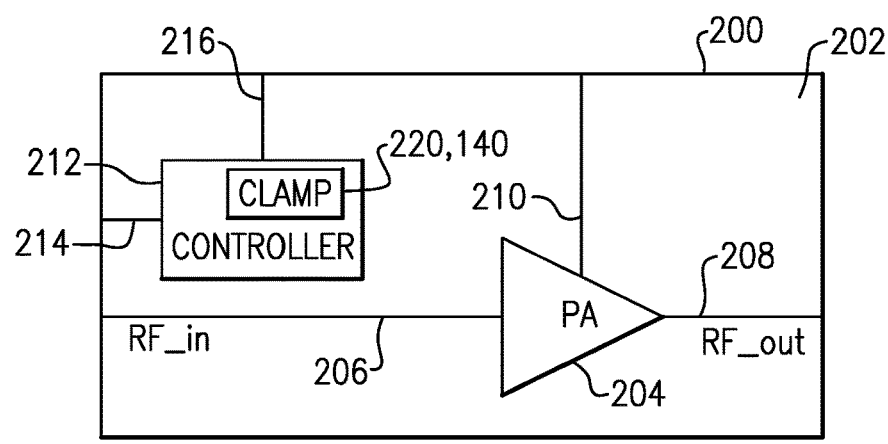

FIGS. 11A-11C show examples of how a clamp circuit (220, 140) having one or more features as described herein can be implemented within the chip device 200 of FIGS. 9 and 10.

In some embodiments, a clamp circuit (220, 140) can be implemented so as to be associated with a controller 212 of the chip device 200. For example, and as shown in FIG. 11A, a clamp circuit (220, 140) can be implemented along the supply path 216 for the controller 212, but generally outside of what can be considered to be the controller 212. In another example, and as shown in FIG. 11B, a clamp circuit (220, 140) can be implemented as a part of what can be considered to be the controller 212.

In some embodiments, a clamp circuit (220, 140) can be implemented so as to be associated with a power amplifier 204 of the chip device 200. For example, and as shown in FIG. 11B, a clamp circuit (220, 140) can be implemented along the supply path 210 for the power amplifier 204, but generally outside of what can be considered to be the power amplifier 204. In another example, a clamp circuit (220, 140) can be implemented as a part of what can be considered to be the power amplifier 204.

In some embodiments, the clamp circuit (220, 140) of FIGS. 9-11 may or may not include a ballasting feature described herein in reference to FIG. 5. Similarly, in some embodiments, the clamp circuit 140 of FIG. 3 may or may not include a ballasting feature described herein in reference to FIG. 5.

As described herein, a partial feedback clamp and/or ballasted RC-triggered clamp can provide a number of desirable features. Examples of analysis and comparison indicate that surge performance of ballasted RC clamp greatly improves due to the ballasting while keeping HBM performance reasonable. In addition, DC leakage current remains comparable to the existing edge-triggered clamp. The partial feedback combination clamp can also be a substitute with comparable HBM performance, reasonable high surge rating, and two orders degradation in standby leakage current.

Figure 12:
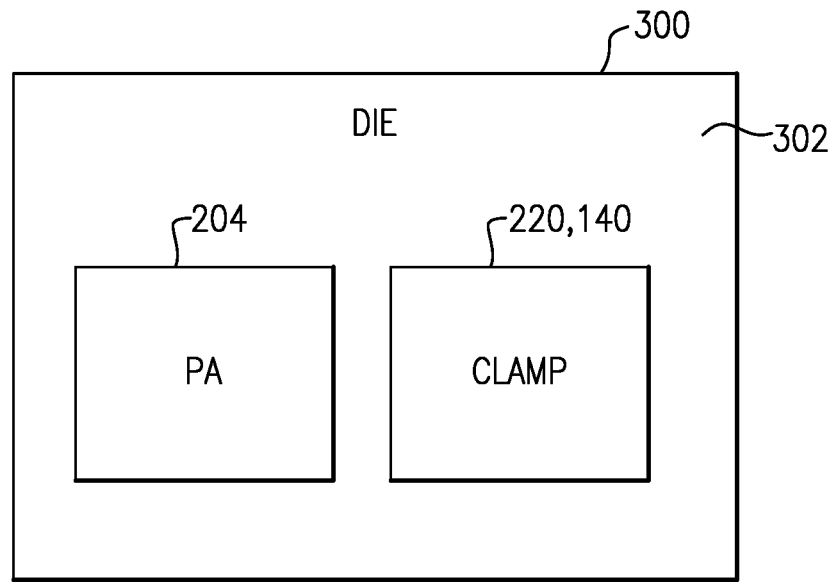
FIG. 12 shows that in some embodiments, a clamp having one or more features as described herein can be implemented on a die.

FIG. 12 shows that in some embodiments, a clamp (220, 140) having one or more features as described herein can be implemented on a die 300. Such a die can include a semiconductor substrate 302. In some embodiments, the same die 300 can also include a power amplifier circuit 204. In some embodiments, the die 300 can be the chip device 200 of FIG. 9.

Figure 13:
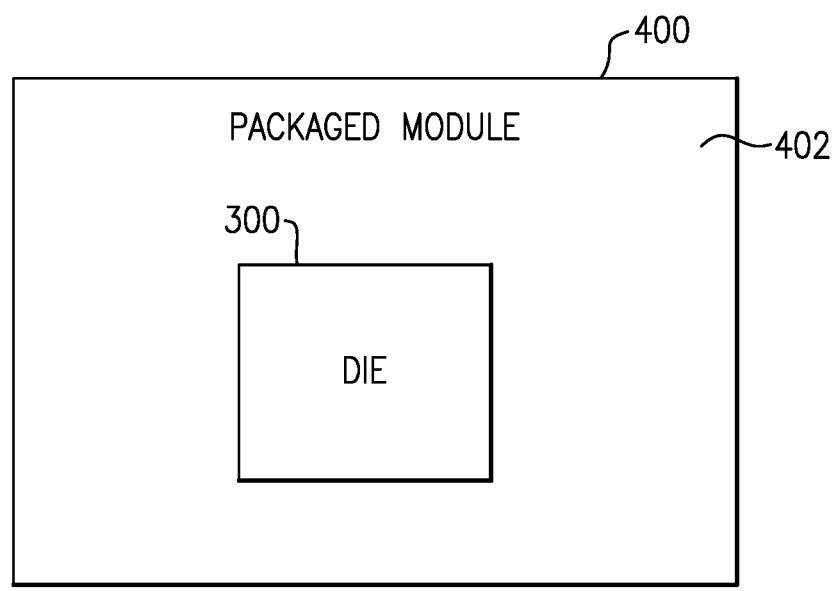
FIG. 13 shows that in some embodiments, a die such as the die of FIG. 12 can be implemented in a packaged module.

FIG. 13 shows that in some embodiments, a die 300 such as the die of FIG. 12 can be implemented in a packaged module 400. Such a packaged module can include a packaging substrate 402 configured to receive a plurality of components. At least some of the components mounted on the packaging substrate 402 can include a die 300, such as the die 300 of FIG. 12.

In some embodiments, a packaged module can be the chip device 200 of FIG. 9. Such a packaged module can include a die with or without a clamp having one or more features as described herein.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 14:
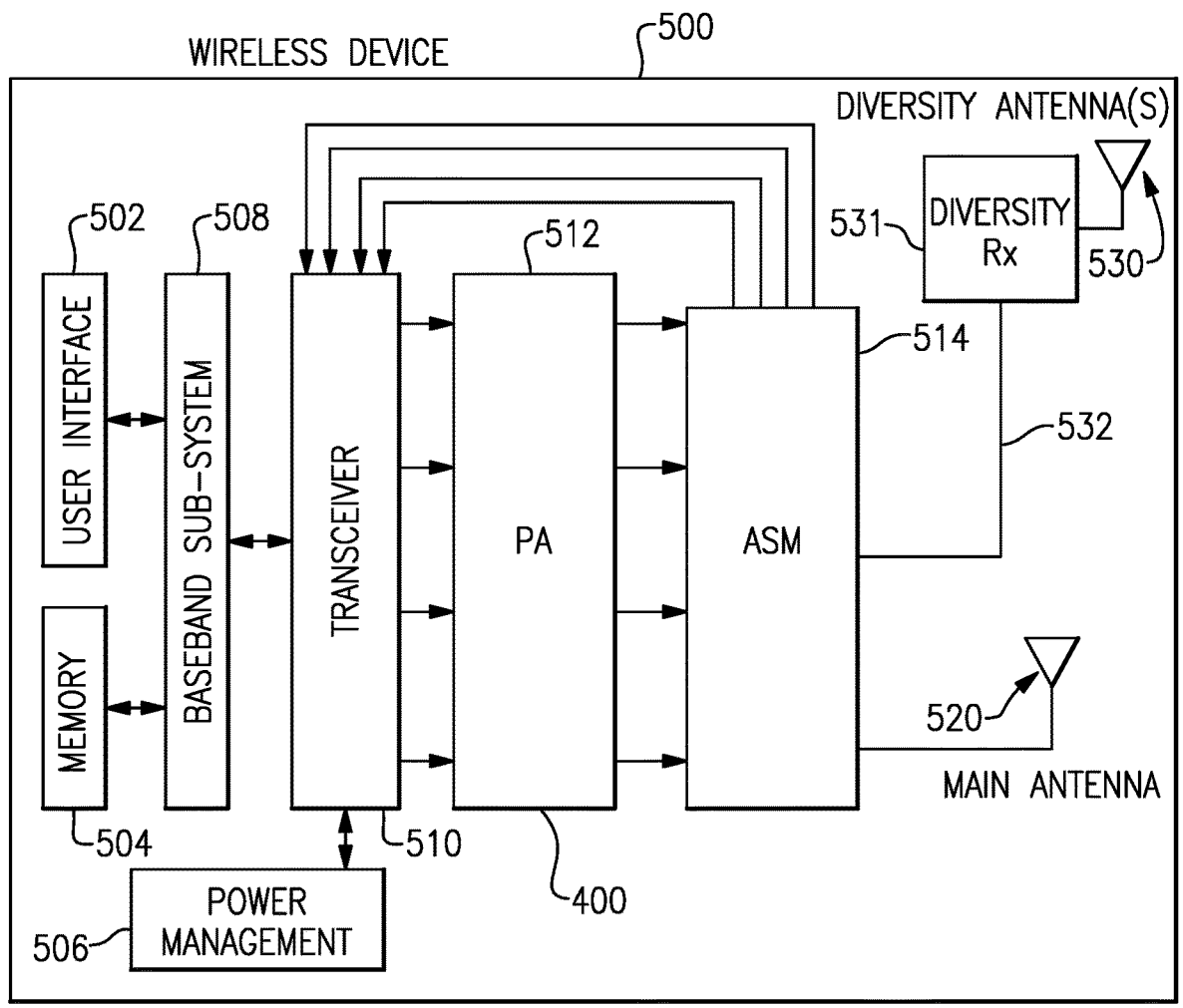
FIG. 14 depicts an example wireless device having one or more advantageous features described herein.

FIG. 14 depicts an example wireless device 500 having one or more advantageous features described herein. In some embodiments, a module 400 that includes one or more power amplifiers can also include one or more clamps having one or more features as described herein.

In the example of FIG. 14, power amplifiers (PAs) are depicted in a PA module 512; however, it will be understood that such power amplifiers can be implemented in one or more functional blocks, one or more devices such as die or modules, etc. Such power amplifiers can receive their respective RF signals from a transceiver 510 that can be configured and operated to generate RF signals to be amplified and transmitted, and to process received signals. The transceiver 510 is shown to interact with a baseband subsystem 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example of FIG. 14, a diversity receive (DRx) module 531 can be implemented between one or more diversity antennas (e.g., diversity antenna 530) and the front-end module 100. Such a configuration can allow an RF signal received through the diversity antenna 530 to be processed (in some embodiments, including amplification by an LNA) with little or no loss of and/or little or no addition of noise to the RF signal from the diversity antenna 530. Such processed signal from the DRx module 540 can then be routed to the front-end module 100 through one or more signal paths. In some embodiments, the wireless device 500 may or may not include the foregoing DRx functionality.

In the example of FIG. 14, a plurality of antennas (e.g., 520a, 520b) can be configured to, for example, facilitate transmission of RF signals from the PA module 512. In some embodiments, receive operations can also be achieved through some or all of the antennas 520a, 520b.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency circuit comprising:
an amplifier having a supply node;
a controller configured to control operation of the amplifier; and
a clamp circuit including a feedback clamp implemented to direct a current associated with either or both of an electrostatic discharge and a surge at the supply node to a ground node, the feedback clamp including a first transistor that couples the supply node and the ground node, and configured to be electrically non-conductive when in an inactive state and to be electrically conductive when in an active state.

2. The radio-frequency integrated circuit of claim 1 wherein the amplifier is a power amplifier.

3. The radio-frequency integrated circuit of claim 1 wherein the first transistor is a field-effect transistor having a drain coupled to the supply node and a source coupled to the ground node.

4. The radio-frequency integrated circuit of claim 3 wherein the feedback clamp further includes a feedback circuit having a second transistor, a first resistance, and a second resistance arranged in series between the supply node and the ground node, such that a source of the second transistor is coupled to the supply node, and the gate of the first transistor is coupled to a node between the first and second resistances.

5. The radio-frequency integrated circuit of claim 4 wherein the feedback clamp further includes a surge pull-down circuit having a third transistor, a third resistance, a fourth transistor and a fifth transistor arranged in series between the supply node and the ground node, such that a source of the third transistor is coupled to the supply node, a gate of the second transistor is coupled to a node between the third resistance and the fourth transistor, and the gate of the first transistor is coupled to a gate of the third transistor.

6. The radio-frequency integrated circuit of claim 5 wherein the feedback clamp further includes a sixth transistor that couples the supply node and the gate of the third transistor.

7. The radio-frequency integrated circuit of claim 6 wherein the feedback clamp further includes a transient detection circuit having a fourth resistance and a capacitance arranged in series between the supply node and the ground node, such that a gate of the fifth transistor is coupled to a node between the fourth resistance and the capacitance.

8. The radio-frequency integrated circuit of claim 7 wherein the feedback clamp is configured to be in the active state for a prolonged period of time due to a partial feedback provided at least in part by the feedback circuit.

9. The radio-frequency integrated circuit of claim 8 wherein the feedback clamp is configured such that when RC, a product of the fourth resistance and the capacitance of the transient detection circuit, is below a first selected time constant, the sixth transistor turns on thereby causing the third transistor to turn off, and the second transistor turns on to enable the first transistor to provide a discharge path between the supply node and the ground node.

10. The radio-frequency integrated circuit of claim 9 wherein the feedback clamp is further configured such that when the value of RC is greater than a second time constant, the fourth and fifth transistors are activated while the gate of the first transistor is pulled low, such that the gate of the first transistor is partially fed back and pulled high from the second transistor turning on by the fourth and fifth transistors surge pull down.

11. The radio-frequency integrated circuit of claim 3 wherein the first transistor is configured such that drain to gate and source to gate regions of the first transistor are un-silicided.

12. The radio-frequency integrated circuit of claim 1 wherein the clamp circuit includes a ballasted RC-triggered clamp.

13. The radio-frequency integrated circuit of claim 1 wherein the radio-frequency integrated circuit is implemented on a semiconductor substrate.

14. A radio-frequency module comprising:
a packaging substrate; and
a radio-frequency integrated circuit implemented on the packaging substrate, the radio-frequency integrated circuit including an amplifier having a supply node, a controller configured to control operation of the amplifier, and a clamp circuit including a feedback clamp implemented to direct a current associated with either or both of an electrostatic discharge and a surge at the supply node to a ground node, the feedback clamp including a first transistor that couples the supply node and the ground node, and configured to be electrically non-conductive when in an inactive state and to be electrically conductive when in an active state.

15. The radio-frequency module of claim 14 wherein substantially all of the amplifier, the controller and the clamp circuit are implemented on a common semiconductor die.

16. The radio-frequency module of claim 14 wherein the clamp circuit includes a ballasted RC-triggered clamp.

17. A wireless device comprising:
a transceiver;
a radio-frequency integrated circuit in communication with the transceiver, the radio-frequency integrated circuit including an amplifier having a supply node, a controller configured to control operation of the amplifier, and a clamp circuit including a feedback clamp implemented to direct a current associated with either or both of an electrostatic discharge and a surge at the supply node to a ground node, the feedback clamp including a first transistor that couples the supply node and the ground node, and configured to be electrically non-conductive when in an inactive state and to be electrically conductive when in an active state; and
an antenna in communication with the radio-frequency integrated circuit.

* * * * *